United States Patent
Zhang et al.

(10) Patent No.: US 10,581,416 B2
(45) Date of Patent: Mar. 3, 2020

(54) EXTERNAL AND DUAL RAMP CLOCK SYNCHRONIZATION

(71) Applicant: TEXAS INSTRUMENTS INCORPORATED, Dallas, TX (US)

(72) Inventors: Junhong Zhang, Bedford, NH (US); Angelo Pereira, Allen, TX (US); Pinar Korkmaz, Allen, TX (US); Sujan Manohar, Dallas, TX (US); Michael Munroe, Auburn, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/361,154

(22) Filed: Mar. 21, 2019

(65) Prior Publication Data
US 2019/0393868 A1 Dec. 26, 2019

Related U.S. Application Data

(60) Provisional application No. 62/690,100, filed on Jun. 26, 2018.

(51) Int. Cl.
*H03K 4/06* (2006.01)
*H03L 7/00* (2006.01)
(Continued)

(52) U.S. Cl.
CPC .............. *H03K 5/135* (2013.01); *G06F 1/12* (2013.01); *H03K 3/027* (2013.01)

(58) Field of Classification Search
CPC ........... H03K 5/135; H03K 3/027; G06F 1/12
See application file for complete search history.

(56) References Cited

U.S. PATENT DOCUMENTS 6,060,920 A * 5/2000 Saeki ..................... H03K 5/133
327/152
7,626,430 B2 * 12/2009 Motoyui .................. H03K 4/06
327/131
(Continued)

OTHER PUBLICATIONS

Smedt et al., "A 66 uW 86 ppm/ C Fully-Integrated 6 MHz Wienbridge Oscillator With a 172 dB Phase Noise FOM," IEEE Journal of Solid-State Circuits, vol. 44, No. 7, Jul. 2009, pp. 1990-2001.
(Continued)

*Primary Examiner* — Kenneth B Wells
(74) *Attorney, Agent, or Firm* — Tuenlap Chan; Charles A. Brill; Frank D. Cimino

(57) ABSTRACT

Aspects of the present disclosure provide for a method. In some examples, the method includes receiving a synchronization signal, dividing the synchronization signal to form a first divided signal and a second divided signal, generating a first ramp signal and a second ramp signal, setting a latch output to a logical high value when the first divided signal has a logical high value or a value of the first ramp signal exceeds a value of a reference signal, setting the latch output to a logical low value when the second divided signal has a logical high value or a value of the second ramp signal exceeds the value of the reference signal, generating a synchronization clock according to the latch output and an inverse of the latch output, and outputting the latch output or the synchronization clock as a clock signal based on a value of a synchronization active signal.

20 Claims, 6 Drawing Sheets

(51) Int. Cl.
　　　H02M 3/158　　(2006.01)
　　　H03K 5/135　　(2006.01)
　　　G06F 1/12　　(2006.01)
　　　H03K 3/027　　(2006.01)

(56) References Cited

U.S. PATENT DOCUMENTS

| | | | | |
|---|---|---|---|---|
| 7,746,130 B2* | 6/2010 | Chang | ............ | H03F 3/2173 |
| | | | | 327/131 |
| 8,044,690 B2* | 10/2011 | Patel | ............ | H03F 3/217 |
| | | | | 327/131 |
| 9,344,070 B2* | 5/2016 | Luan | ............ | H03K 3/0231 |
| 10,367,484 B2* | 7/2019 | Zhao | ............ | H02M 3/1584 |

OTHER PUBLICATIONS

Sundaresan et al., "Process and Temperature Compensation in a 7-MHz CMOS Clock Oscillator," IEEE Journal of Solid-State Circuits, vol. 41, No. 2, Feb. 2006, pp. 433-442.

Soldera et al., "A temperature compensated CMOS relaxation oscillator for low power applications," 2012 25th Symposium on Integrated Circuits and Systems Design (SBCCI), 4 pages.

Zhang et al., "A 3.2ppm/C Second-Order Temperature Compensated CMOS On-Chip Oscillator Using Voltage Ratio Adjusting Technique," Symposium on VLSI Circuits Digest of Technical Papers, 2017, 2 pages.

Wang et al., "A Compact CMOS Ring Oscillator with Temperature and Supply Compensation for Sensor Applications," IEEE Computer Society Annual Symposium on VLSI, 2014, pp. 267-272.

Lee et al., "A 10MHz 80uW 67 ppm/C CMOS Reference Clock Oscillator with a Temperature Compensated Feedback Loop in 0.18um CMOS," Symposium on VLSI Circuits Digest of Technical Papers, 2009, pp. 226-227.

De Vita et al., "Low-Voltage Low-Power CMOS Oscillator with Low Temperature and Process Sensitivity," 2007 IEEE International Symposium on Circuits and Systems, May 27-30, 2007, pp. 2152-2155.

Lu et al., "A Low Power Relaxation Oscillator with Process Insensitive Auto-Calibration Scheme," 2016 IEEE Asia Pacific Conference on Circuits and Systems (APCCAS), Jan. 5, 2017, pp. 694-697.

Mikulic et al., "Relaxation Oscillator Calibration Technique with Comparator Delay Regulation," 2016 39th International Convention on Information and Communication Technology, Electronics and Microelectronics (MIPRO), May 30-Jun. 3, 2016, pp. 57-61.

Aita et al., "A 0.45V CMOS Relaxation Oscillator with +2.5% Frequency Stability from −55C to 125C," 2015 IEEE International Symposium on Circuits and Systems (ISCAS), May 24-27, 2015, pp. 493-496.

Wang et al. "A 12.77-MHz 31 ppm/C On-Chip RC Relaxation Oscillator With Digital Compensation Technique," IEEE Transactions on Circuits and Systems—I: Regular Papers, vol. 63, No. 11, Nov. 2016, pp. 1816-1824.

Lu et al., "A high linearity current-controlled CMOS relaxation oscillator with frequency self-calibration technique," Analog Integr Circ Sig Process, (2017) 92:29-37.

Han et al., "A Self-Calibration Technique for On-Chip Precise Clock Generator," IEEE Transactions on Circuits and Systems—II: Express Briefs, vol. 62, No. 12, Dec. 2015, pp. 1114-1118.

\* cited by examiner

EXTERNAL AND DUAL RAMP CLOCK SYNCHRONIZATION

CROSS-REFERENCE TO RELATED APPLICATIONS

The present application claims priority to U.S. Provisional Patent Application No. 62/690,100, which was filed Jun. 26, 2018, is titled "Dual-Ramp Synchronizing Oscillator CLK Scheme," and is hereby incorporated herein by reference in its entirety.

BACKGROUND

Some electrical circuits rely on a clock signal for operation. The clock signal can be generated internally, either by the electrical circuit or by another circuit implemented on the same die or within the same package as the electrical circuit, or the clock signal can be received by the electrical circuit from another outside device or component via interconnects coupling the electrical circuit to the outside device. Sometimes, the electrical circuit includes an ability to operate based on both the internally generated clock signal and the clock signal received from an outside device, selectively or programmatically.

SUMMARY

Some aspects of the present disclosure provide for a circuit. In some examples, the circuit includes a dual-ramp generator, a d-flip flop, a first logic circuit, a second logic circuit, a latch, and a two-edge OR circuit. The d-flip flop has a first input coupled to a first node, a second input coupled to a second node, a first output, and a second output coupled to the second node. The first logic circuit has a first input coupled to the second node, a second input coupled to a first output of the dual-ramp generator, and an output. The second logic circuit has a first input coupled to the first output of the d-flip flop, a second input coupled to a second output of the dual-ramp generator, and an output. The latch has a first input coupled to the output of the first logic circuit, a second input coupled to the output of the second logic circuit, a first output coupled to a third node, and a second output coupled to a fourth node. The two-edge OR circuit has a first input coupled to the first output of the latch, a second input coupled to the second output of the latch, and an output.

Other aspects of the present disclosure provide for a system. In some examples, the system includes a clock generator configured to generate a clock signal (CLK) and a processing element configured to receive and operate according to CLK. The clock generator includes a dual-ramp generator, a sync detection circuit, a d-flip flop, a first logical OR circuit, a second logical OR circuit, a latch, a two-edge OR circuit, and a multiplexer. The dual-ramp generator has a first output and a second output, the dual-ramp generator configured to output a signal having a logical high value at the second output of the dual-ramp generator when a first ramp signal (RAMP1) exceeds a reference voltage (Vref) and output a signal having a logical high value at the first output of the dual-ramp generator when a second ramp signal (RAMP2) exceeds Vref. The sync detection circuit has a first input, a second input coupled to a first node configured to receive a synchronization signal (SYNC), a first output, and a second output, the sync detection circuit configured to generate a synchronization active signal (SYNC_ACTIVE) based at least partially on CLK and SYNC. The d-flip flop has a first input coupled to the first node, a second input coupled to a second node, a data output, and a data inverse output coupled to the second node, the d-flip flop configured to divide SYNC to generate a first divided signal (SYNC1) and a second divided signal (SYNC2). The first logical OR circuit has a first input coupled to the second node, a second input coupled to the first output of the dual-ramp generator, and an output. The second logical OR circuit has a first input coupled to the first output of the d-flip flop, a second input coupled to the second output of the dual-ramp generator, and an output. The latch has a reset input coupled to the output of the first logical OR circuit, a set input coupled to the output of the second logical OR circuit, a data output coupled to a third node, and a data inverse output coupled to a fourth node, the latch configured to output a signal Q via the data output and a signal Q_Z via the data inverse output. The two-edge OR circuit has a first input coupled to the first output of the latch, a second input coupled to the second output of the latch, and an output, the two-edge OR circuit configured to generate a signal SYNC_CLK having rising edges corresponding to rising edges in both Q and Q_Z. The multiplexer has a first input coupled to the third node, a second input coupled to the output of the two-edge OR circuit, an output coupled to the first input of the sync detection block and configured to output CLK, and a control input coupled to the first output of the sync detection circuit, the multiplexer configured to output Q as CLK when SYNC_ACTIVE has a logical low value and output SYNC_CLK as CLK when SYNC_ACTIVE has a logical high value.

Other aspects of the present disclosure provide for a method. In some examples, the method includes receiving a synchronization signal, dividing the synchronization signal to form a first divided signal and a second divided signal, generating a first ramp signal and a second ramp signal, setting a latch output to a logical high value when the first divided signal has a logical high value or a value of the first ramp signal exceeds a value of a reference signal, setting the latch output to a logical low value when the second divided signal has a logical high value or a value of the second ramp signal exceeds the value of the reference signal, generating a synchronization clock according to the latch output and an inverse of the latch output, and outputting the latch output or the synchronization clock as a clock signal based on a value of a synchronization active signal.

BRIEF DESCRIPTION OF THE DRAWINGS

For a detailed description of various examples, reference will now be made to the accompanying drawings in which.

DETAILED DESCRIPTION

Figure 1:
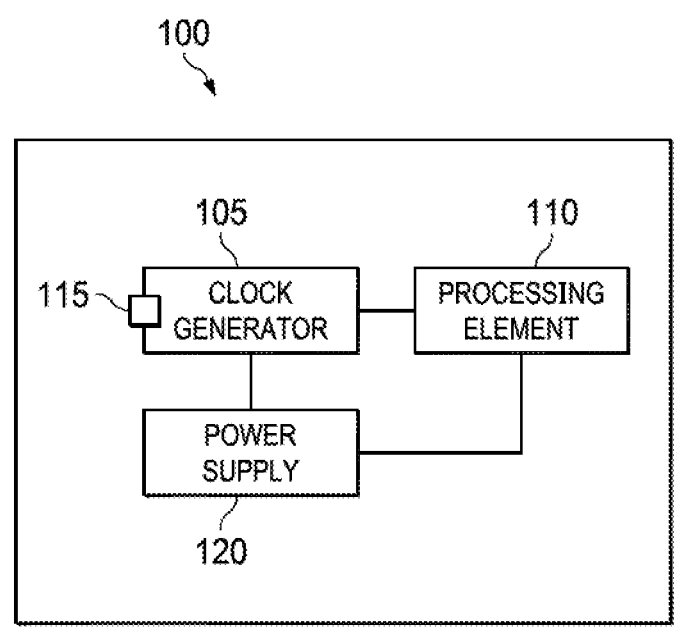
FIG. 1 shows a block diagram of an illustrative system in accordance with various examples.

In some circumstances in which an electrical device both includes (or is coupled to) internal clock generation circuitry configured to generate an internal clock signal and is configured to receive and operate according to an external clock signal received from an outside device, in at least some circumstances the internal clock signal and the external clock signal should be synchronized before providing a clock signal to the electrical device for operation of the electrical device. In some examples, the internal clock generation circuitry is ramp-based, such that rising and falling edges of the internal clock signal are controlled at least partially by a voltage of charging and/or discharging capacitors compared to a reference voltage (Vref). In an example of dual-ramp internal clock generation circuitry, a rising edge occurs in the internal clock signal when a voltage of a first capacitor reaches Vref and a falling edge occurs in the internal clock signal when a voltage of a second capacitor reaches Vref. In at least some examples, a discharge rate and/or discharge time of the capacitors is unrelated to a period of the internal clock signal such that the period of the internal clock signal does not vary with discharge time of the capacitors. In at least some circumstances in which the internal clock signal does not have dual-ramp scheme a possibility exists for the discharge rate and/or discharge time of the capacitors to impact the period of the internal clock signal (e.g., by not fully discharging prior to charging again).

When an external clock signal is received for synchronization with the internal clock signal, when the external clock signal also has the fifty percent duty cycle, synchronization of the internal and external clock signals may be comparatively trivial. However, limiting a clock signal to only operating at fifty percent duty cycle limits application of the clock generation circuitry to only certain specific applications, potentially reducing available application environments for the clock generation circuitry and/or increasing implementation complexity from a customer's point of view in providing clock synchronization utilizing the clock generation circuitry. Additionally, while some techniques exist for synchronizing clock signals, such as a phase-locked loop (PLL), implementing these other techniques is often undesirable because of the additional footprint on a silicon die required for implementing these techniques such as a PLL, additional die area by these techniques, or other various considerations.

At least some aspects of the present disclosure provide for a circuit. The circuit is, in some examples, a clock generation circuit. In various examples, the circuit is configured to generate an internal clock signal according to a dual-ramp scheme, receive an external clock signal (SYNC), and synchronize an output of the circuit (CLK) to the external clock signal during a synchronization period of the circuit. In at least some examples, a duty cycle of SYNC is unlimited and CLK can be synced to any chosen duty cycle of SYNC. For example, in the circuit of the present disclosure, the duty cycle of SYNC is not limited to fifty percent, as discussed above. When SYNC is not received, the circuit is configured to output the internally generated clock signal. In at least some examples, the circuit is configured to synchronize CLK to SYNC by dividing a frequency of SYNC to generate a first divided signal (SYNC1) and a second divided signal (SYNC2), wherein SYNC2 is an inverse of SYNC1 (e.g., a phase of SYNC2 is shifted 180 degrees with respect to SYNC1). In some examples, SYNC1 and SYNC2 have a frequency approximately one-half of a frequency of SYNC. In other examples, SYNC1 and SYNC2 have any suitable frequency with respect to SYNC, such as one-fourth, one-third, one-eighth, or any other suitable fraction such that the frequency of SYNC1 and SYNC2 is less than the frequency of SYNC. When the circuit is in the synchronization period (e.g., as indicated by a signal SYNC_ACTIVE having a logical high value), charging of capacitors to generate a signal RAMP1 and a signal RAMP2 is slowed such that a rising edge occurs in SYNC1 prior to RAMP1 reaching Vref and a rising edge occurs in SYNC2 prior to RAMP2 reaching Vref. Subsequently, while SYNC_ACTIVE has the logical high value, positive and inverse internal signals generated based on SYNC1 and SYNC2 are recombined to form a synchronized clock signal (SYNC_CLK) for output by the circuit as CLK. Alternatively, the positive internal signal is output as CLK when SYNC_ACTIVE has a logical low value. In at least some examples, to accurate generate CLK according to SYNC, SYNC has a frequency at least double an internal clock frequency of the circuit (e.g., such as a frequency of a clock generated according to the dual-ramp scheme).

Turning now to FIG. 1, a block diagram of an illustrative system 100 is shown. In at least some examples, the system 100 is representative of a consumer electronic device that may utilize one or more clock signals, such as a multi-phase device that has functionality of both generating an internal clock signal or syncing to an externally received clock signal. In at least some examples, the system 100 is representative of a consumer or other electronic device, such as a wearable device (e.g., a headset, earbuds, hearing aids, smart watches, fitness accessories, patient monitors, etc.), a smartphone, a laptop computer, a notebook or netbook computer, a tablet device, or any other device that utilizes one or more clock signals in operation of the device. In at least some examples, the system 100 includes a clock generator 105 and a processing element 110. In some examples, the clock generator 105 includes an external clock pin 115. The external clock pin 115, in some examples, is configured to receive SYNC, as discussed herein. In at least some examples, the external clock pin is an input pin of the system 100 (e.g., exposed to devices outside of the system 100), while in other examples the external clock pin 115 is only available within the system 100 (e.g., not exposed to devices outside of the system 100 and instead exposed to other circuits (not shown) within the system 100.

The clock generator 105, in at least some examples, includes a dual-ramp clock generator (not shown) configured to generate CLK according to a dual-ramp scheme. The clock generator 105 is further configured to receive SYNC via the external clock pin 115 and synchronize CLK to SYNC. The clock generator 105 is coupled to the processing element 110 and provides CLK, in at least some examples, to the processing element 110. The processing element 110 operates, in some examples, according to CLK (e.g., where at least some operations of the processing element 110). In at least some examples, one or more other components (not shown) of the system 100, or coupled directly, indirectly, or wirelessly, to the system 100 and/or clock generator 105, also receive and operate according to CLK.

In at least some examples, the system 100 further includes a power supply 120 coupled to the clock generator 105 and the processing element 110. The power supply 120 is, in some examples, any suitable power management circuitry configured to provide power to the clock generator 105 and the processing element 110 from a power source such as a battery, mains power provided via an adapter, etc.

Figure 2:
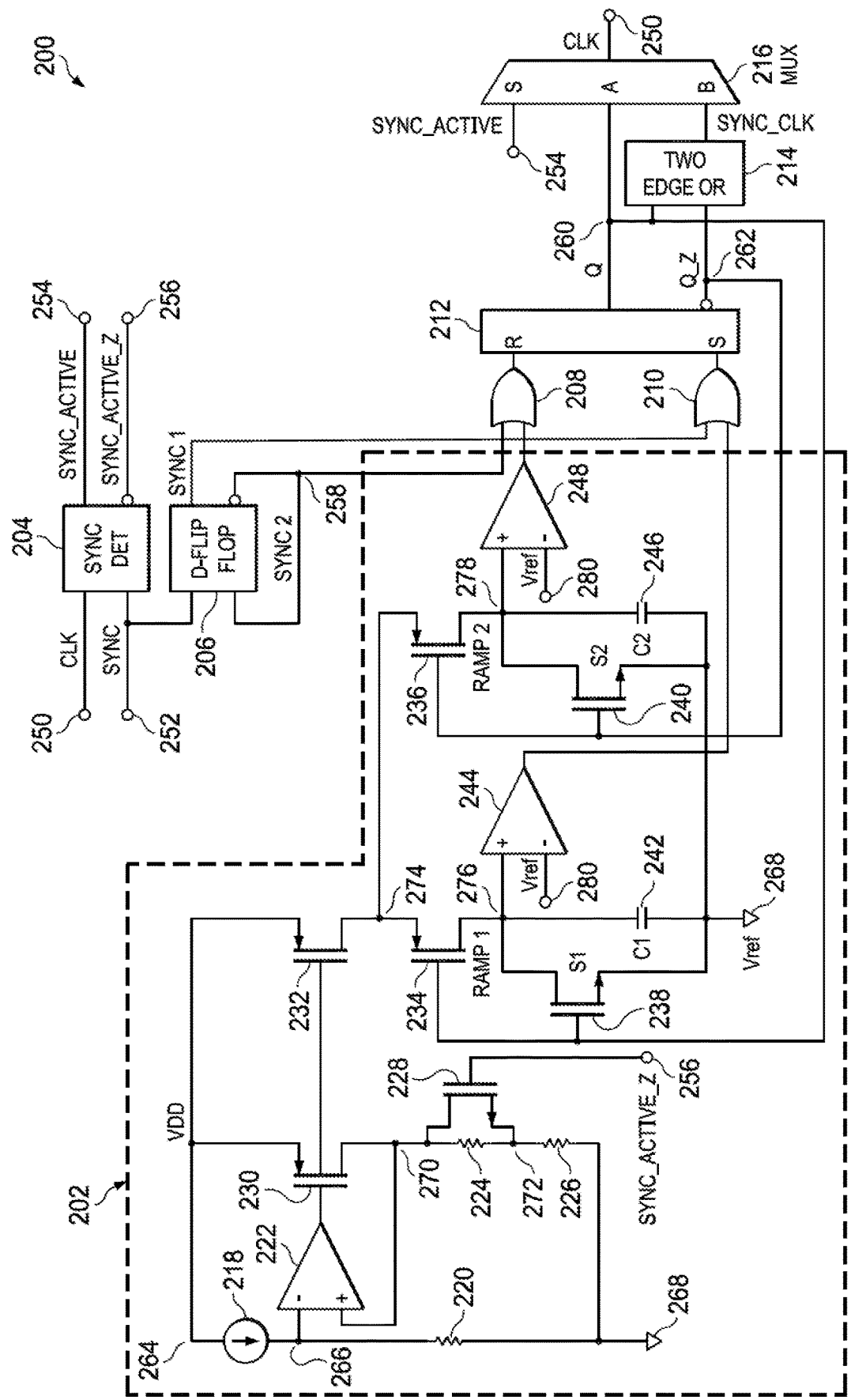
FIG. 2 shows a schematic diagram of an illustrative circuit in accordance with various examples.

Turning now to FIG. 2, a schematic diagram of an illustrative circuit 200 is shown. In at least some examples, the circuit 200 is suitable for implementation as the clock generator 105 of the system 100 of FIG. 1. In other examples, the circuit 200 is suitable for implementation as a clock generator in any electronic device that relies on a clock signal for at least some operations of the electronic device. The circuit 200 includes, in some examples, a dual-ramp generator 202, a sync detection circuit 204, a d-flip flop 206, an OR logic circuit 208, and OR logic circuit 210, a latch 212, a two-edge OR circuit 214, and a multiplexer 216. The dual-ramp generator 202 includes, in some examples, a current source 218, a resistor 220, a comparator 222, a resistor 224, a resistor 226, a transistor 228, a transistor 230, a transistor 232, a transistor 234, a transistor 236, a transistor 238, a transistor 240, a capacitor 242, a comparator 244, a capacitor 246, and a comparator 248. In some examples, the transistor 230, the transistor 232, the transistor 234, and the transistor 236 are each p-type field effect transistors (FETs) (pFETs) and the transistor 228, the transistor 238, and the transistor 240 are n-type FETs (nFETs). The sync detection circuit 204 includes, in some examples, any suitable analog and/or digital circuitry configured to count a number of rising edges of a first signal, reset the count of rising edges of the first signal on receipt of a rising edge of a second signal, and output a signal when the count of rising edges of the first signal exceeds a threshold. The latch 212, in at least some examples, is a set-reset (SR) latch. In other examples, the latch 212 is any suitable latch having functionality substantially similar to that described herein.

In at least one example architecture of the circuit 200, the sync detection circuit 204 has a first input coupled to a node 250, a second input coupled to a node 252, a first output coupled to a node 254, and a fourth output coupled to a node 256. The d-flip flop 206 has a first input (e.g., a CLK input) coupled to the node 252, a second input (e.g., a data input) coupled to a node 258, a first output coupled to a first input of the OR logic circuit 210, and a second output coupled to the node 258 and a first input of the OR logic circuit 208. A first output of the dual-ramp generator 202 is coupled to a second input of the OR logic circuit 210 and a second output of the dual-ramp generator 202 is coupled to a second input of the OR logic circuit 208. An output of the OR logic circuit 208 is coupled to a first input (e.g., such as a reset input) of the latch 212 and an output of the OR logic circuit 210 is coupled to a second input (e.g., such as a set input) of the latch 212. A first output (e.g., a data output) of the latch 212 is coupled to a node 260 and a second output (e.g., an inverse data or "not data" output) of the latch 212 is coupled to a node 262. A first input of the two-edge OR circuit 214 is coupled to the node 260, a second input of the two-edge OR circuit 214 is coupled to the node 262, and an output of the two-edge OR circuit 214 is coupled to a second input of the multiplexer 216. A first input of the multiplexer 216 is coupled to the node 260, a control input of the multiplexer 216 is coupled to the node 254, and an output of the multiplexer 216 is coupled to the node 250.

The current source 218 is coupled between a node 264 and a node 266 and the resistor 220 is coupled between the node 266 and a ground terminal 268. A source terminal of the transistor 230 is coupled to the node 264 and a drain terminal of the transistor 230 is coupled to a node 270. An inverting input of the comparator 222 is coupled to the node 266, a non-inverting input of the comparator 222 is coupled to the node 270, and an output of the comparator 222 is coupled to a gate terminal of the transistor 230. The resistor 224 is coupled between the node 270 and a node 272 and the resistor 226 is coupled between the node 272 and the ground terminal 268. A drain terminal of the transistor 228 is coupled to the node 270, a source terminal of the transistor 228 is coupled to the node 272, and a gate terminal of the transistor 228 is coupled to the node 256. A source terminal of the transistor 232 is coupled to the node 264, a drain terminal of the transistor 232 is coupled to a node 274, and a gate terminal of the transistor 232 is coupled to the output of the comparator 222. A source terminal of the transistor 234 is coupled to the node 274, a drain terminal of the transistor 232 is coupled to a node 276, and a gate terminal of the transistor 234 is coupled to the node 260. A source terminal of the transistor 236 is coupled to the node 274, a drain terminal of the transistor 232 is coupled to a node 278, and a gate terminal of the transistor 236 is coupled to the node 262. A drain terminal of the transistor 238 is coupled to the node 276, a source terminal of the transistor 238 is coupled to the ground terminal 268, and a gate terminal of the transistor 238 is coupled to the node 260. A drain terminal of the transistor 240 is coupled to the node 278, a source terminal of the transistor 240 is coupled to the ground terminal 268, and a gate terminal of the transistor 240 is coupled to the node 262. The capacitor 242 is coupled between the node 276 and the ground terminal 268. The capacitor 246 is coupled between the node 278 and the ground terminal 268. The comparator 244 has a noninverting input coupled to the node 276, an inverting input coupled to a node 280, and an output coupled to the second input of the OR logic circuit 210. The comparator 248 has a noninverting input coupled to the node 278, an inverting input coupled to the node 280, and an output coupled to the second input of the OR logic circuit 208.

In an example of operation of the circuit 200 when SYNC_ACTIVE has a logical low value, CLK is generated based on RAMP1 and RAMP2. For example, the current source 218 sources current through the node 266 that together with the resistor 220 is sufficient to cause the comparator 222 to output a signal having a logical low value. The logical low value output of the comparator 222 causes the transistor 230 and the transistor 232 to turn on, entering conductive states and conducting current between their respective source and drain terminals. Because the transistor 230 and the transistor 232 are each controlled according to the same output of the comparator 222, current flowing through the transistor 230 and the transistor 232 is approximately equal and is proportional to a current sourced to the node 266 by the current source 218. Accordingly, modifying the current flowing through the node 266 modifies current flowing through the transistor 232 to control a rate of charging of the capacitor 242 and the capacitor 240. When the signal present at the node 260 (referred to as Q) has a logical low value, the transistor 234 turns on, conducting between the node 274 and the node 276, charging the capacitor 242. Similarly, when Q has a logical low value, a signal present at the node 262 (referred to as Q_Z) has a logical high value and causes the transistor 240 to turn on, discharging the capacitor 246. When a voltage of the capacitor 242 reaches Vref, an output of the comparator 244 transitions to a logical high value and, after passing through the OR logic circuit 210, causes the latch 212 to set, asserting a logical high value at node 260 for Q and a logical low value at node 262 for Q_Z. Q is then passed by the multiplexer 216 from the node 260 to the node 250 for output as CLK.

The high logical value of Q additionally causes the transistor 234 to turn off and cease conducting and the transistor 238 to turn on and begin conducting, discharging the capacitor 242 without impacting a value of Q or CLK. Similarly, the high logical value of Q causes a low logical value of Q_Z, causing the transistor 236 to turn on and begin conducting between then node 274 and the node 278, charging the capacitor 246, and the transistor 240 to turn off and cease conducting. When a voltage of the capacitor 246 reaches Vref, an output of the comparator 248 transitions to a logical high value and, after passing through the OR logic circuit 208, causes the latch 212 to reset, asserting a logical low value at node 260 for Q and a logical high value at node 262 for Q_Z. Q is then passed by the multiplexer 216 from the node 260 to the node 250 for output as CLK and the process of generating Q and Q_Z repeats as discussed above. In some examples, when CLK is generated according to the charging and discharging of the capacitor 242 and the capacitor 246, CLK is referred to as a free-running clock and is internally generated by the circuit 200.

When a rising edge of SYNC is received at the node 252, SYNC_ACTIVE transitions from a logical low value to a logical high value and a signal SYNC_ACTIVE_Z transitions from a logical high value to a logical low value. When SYNC_ACTIVE is a logical high value, the circuit 200 synchronizes CLK to SYNC (e.g., such that for each rising edge in SYNC, a corresponding rising edge occurs at the same frequency and phase in CLK). For example, the d-flip flop 206 receives SYNC and divides SYNC to generate SYNC1 and SYNC2, each of which has a frequency less than SYNC and SYNC2 is an inversion of SYNC1 (e.g., SYNC2 is phase-shifted 180 degrees from SYNC). For example, at a first rising edge of SYNC, assuming that the node 258 is at a logical high value, SYNC1 is output as a logical high value and SYNC2 is output as a logical low value. SYNC2 having a logical low value causes the node 258 (and correspondingly a data input of the d-flip flop 206) to have the logical low value. At a second rising edge of SYNC, SYNC1 is output as a logical low value due to the logical low value present at the node 258 and SYNC2 is subsequently output having a logical high value, after which the process repeats for each subsequent rising edge of SYNC. In this way, the d-flip flop 206 divides the SYNC signal by two to form SYNC1 and, at a 180 degree phase offset, SYNC2. SYNC1 is provided to the OR logic circuit 210 and SYNC2 is provided to the OR logic circuit 208. In at least some examples, to prevent a rising edge in CLK being triggered as discussed above for the condition when SYNC_ACTIVE is the logical low value, when SYNC_ACTIVE is the logical high value the dual-ramp generator 202 slows generation of its output signals. For example, the transistor 228 turns off, ceasing conducting between the node 270 and the node 272 when SYNC_ACTIVE is the logical high value, increasing an amount of resistance between the node 270 and the ground terminal 268 and decreasing a rate of charging of the capacitor 242 and the capacitor 246. In this way, when SYNC_ACTIVE is the logical high value, each rising edge of SYNC1 occurs before RAMP1 reaches Vref to cause the output of the comparator 244 to have a logical high value and each rising edge of SYNC2 occurs before RAMP2 reaches Vref to cause the output of the comparator 248 to have a logical high value. Accordingly, when SYNC1 has the logical high value the OR logic circuit 210 outputs a signal having a logical high value to cause the latch 212 to set, asserting a logical high value at node 260 for Q and a logical low value at node 262 for Q_Z. Similarly, when SYNC2 has the logical high value the OR logic circuit 208 outputs a signal having a logical high value to cause the latch 212 to reset, asserting a logical low value at node 260 for Q and a logical high value at node 262 for Q_Z.

In at least some examples, when SYNC_ACTIVE has the logical high value, a frequency of Q is less than the frequency of SYNC, and thus is not synchronized to SYNC. To reconstruct a signal having a same frequency and phase as SYNC, the two-edge OR circuit 214 detects a rising edge in Q and detects a rising edge in Q_Z and outputs a signal that includes rising edges corresponding to both Q and Q_Z, recreating a signal SYNC_CLK having a same frequency and phase as SYNC. SYNC_CLK is then passed by the multiplexer 216 from the output of the two-edge OR circuit 214 to the node 250 for output as CLK. In some examples, when CLK is generated according to the SYNC, CLK is referred to as a synchronized clock that is synchronized to both the frequency and phase of SYNC.

In at least some examples, the sync detection circuit 204 monitors CLK and SYNC to determine whether to maintain the circuit 200 in the synchronization mode in which CLK is synchronized to SYNC or return the circuit 200 to the free-running mode in which CLK is internally generated by the circuit 200. For example, the sync detection circuit 204 counts a number of received rising edges of CLK. When three rising edges of CLK are received before a rising edge of SYNC is received, the sync detection circuit 204 asserts SYNC_ACTIVE as a logical low value until another rising edge of SYNC is received. When a rising edge of SYNC is received before the sync detection circuit 204 counts three rising edges of CLK, the sync detection circuit 204 resets and restarts the count of rising edges of CLK.

Figure 3:
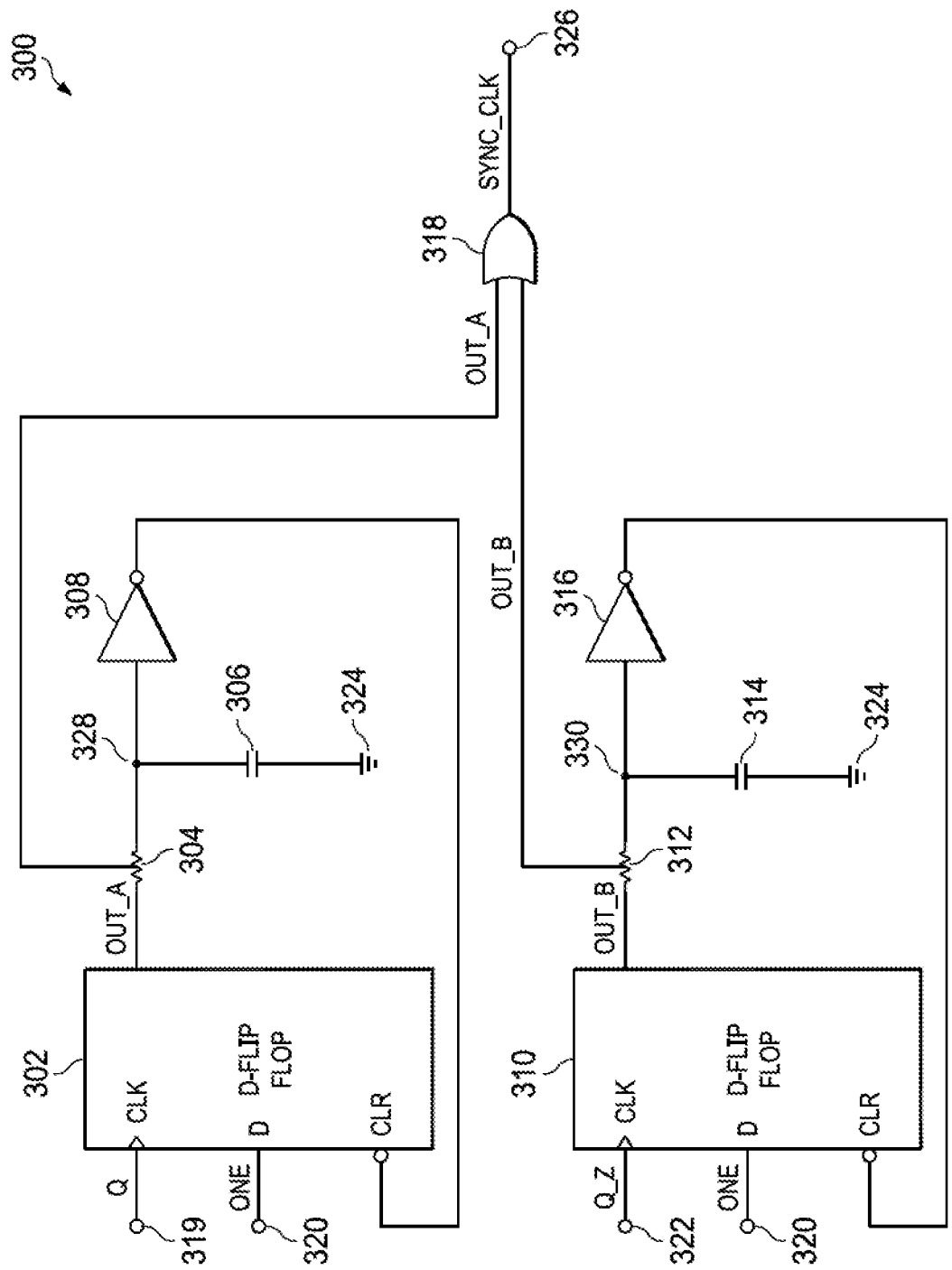
FIG. 3 shows a schematic diagram of an illustrative circuit in accordance with various examples.

Turning now to FIG. 3, a schematic diagram of an illustrative circuit 300 is shown. In at least some examples, the circuit 300 is suitable for implementation as the two-edge OR circuit 214 of the circuit 200 of FIG. 2. In at least some examples, the circuit 300 includes a clocked d-flip flop 302, a resistor 304, a capacitor 306, an inverter 308, a clocked d-flip flop 310, a resistor 312, a capacitor 314, an inverter 316, and an OR logic circuit 318.

In an example architecture of the circuit 300, the clocked d-flip flop 302 has a first input (e.g., a clock input) coupled to a node 319, a second input (e.g., a data input) coupled to a node 320 and configured to receive a logical high value, a clear input, and an output. The resistor 304 is coupled between the output of the clocked d-flip flop 302 and a node 328. The capacitor 306 is coupled between the node 328 and a ground terminal 324. The inverter 308 has an input coupled to the node 328 and an output coupled to the clear input of the clocked d-flip flop 302. The clocked d-flip flop 310 has a first input (e.g., a clock input) coupled to a node 322, a second input (e.g., a data input) coupled to the node 320 and configured to receive a logical high value, a clear input, and an output. The resistor 312 is coupled between the output of the clocked d-flip flop 310 and a node 330. The capacitor 314 is coupled between the node 330 and the ground terminal 324. The inverter 316 has an input coupled to the node 330 and an output coupled to the clear input of the clocked d-flip flop 310. A first input of the OR logic circuit 318 is coupled to the output of the clocked d-flip flop 302 and a second input of the OR logic circuit 318 is coupled to the output of the clocked d-flip flop 310. An output of the OR logic circuit 318 is coupled to a node 326. In at least some examples, the circuit 300 is configured to receive an inverted pair of signals at the node 319 and the node 322. For example, when the circuit 300 is implemented as the two-edge OR circuit 214, the circuit 300 receives Q at the node 319 and receives Q_Z at the node 322. An output of the clocked d-flip flop 302 is referred to as OUT_A and an output of the clocked d-flip flop 310 is referred to as OUT_B. An output of the OR logic circuit 318, when the circuit 300 is implemented as the two-edge OR circuit 214, is SYNC_CLK. Additionally, in at least some examples the clear input of the clocked d-flip flop 302 and the clear input of the clocked d-flip flop 310 are inverting inputs such that the inversion performed by the inverter 308 and the clear input of the clocked d-flip flop 302 cancel out the inversion performed by the inverter 316 and the clear input of the clocked d-flip flop 310 cancel out.

In an example of operation of the circuit 300, when the d-flip flop 302 receives Q at the node 319, the d-flip flop 302 outputs a signal as OUT_A having substantially a same logical value as Q. For example, when Q is received as a signal having a logical high value, OUT_A has a logical high value. When Q is received as a signal having a logical low value, OUT_A has a logical low value. Similarly, when the d-flip flop 310 receives Q_Z at the node 322, the d-flip flop 310 outputs a signal as OUT_B having substantially a same logical value as Q_Z. For example, when Q_Z is received as a signal having a logical low value, OUT_B has a logical low value. When Q_Z is received as a signal having a logical high value, OUT_B has a logical high value. As discussed above with respect to FIG. 2, Q_Z is an inversion of Q (e.g., such that Q_Z has a phase shifted 180 degrees from that of Q and SYNC) and both Q and Q_Z have a frequency divided from SYNC (e.g., such that, in some examples, Q and Q_Z are each one-half of the frequency of SYNC). Accordingly, in at least some examples, rising edges of both Q and Q_Z correspond to rising edges in SYNC. Correspondingly, rising edges of OUT_A and OUT_B correspond to the rising edges in SYNC. The OR logic circuit 318 receives both OUT_A and OUT_B and outputs SYNC_CLK to the node 326, where SYNC_CLK is a recreated version of SYNC, recreated according to OUT_A and OUT_B, which are determined according to Q and Q_Z which are determined according to SYNC2 and SYNC1 that are derived from SYNC. For example, when SYNC has a logical high value for a first period of time, the logical high value is reflected in OUT_B having a logical high value for the first period of time and SYNC_CLK having a logical high value for the first period of time. When SYNC has a logical high value for a second period of time, the logical high value is reflected in OUT_A having a logical high value for the second period of time and SYNC_CLK having a logical high value for the second period of time, recreating SYNC as SYNC_CLK at the node 326, with SYNC_CLK having a same frequency and phase as SYNC. In at least some examples, the resistor 304 and the capacitor 306 form a resistor-divider timer circuit, the time constant of which determines a pulse width of OUT_A, and correspondingly a pulse width of a first portion of SYNC_CLK. Similarly, the resistor 330 and the capacitor 314 form a resistor-divider timer circuit, the time constant of which determines a pulse width of OUT_B, and correspondingly a pulse width of a second portion of SYNC_CLK.

Figure 4:
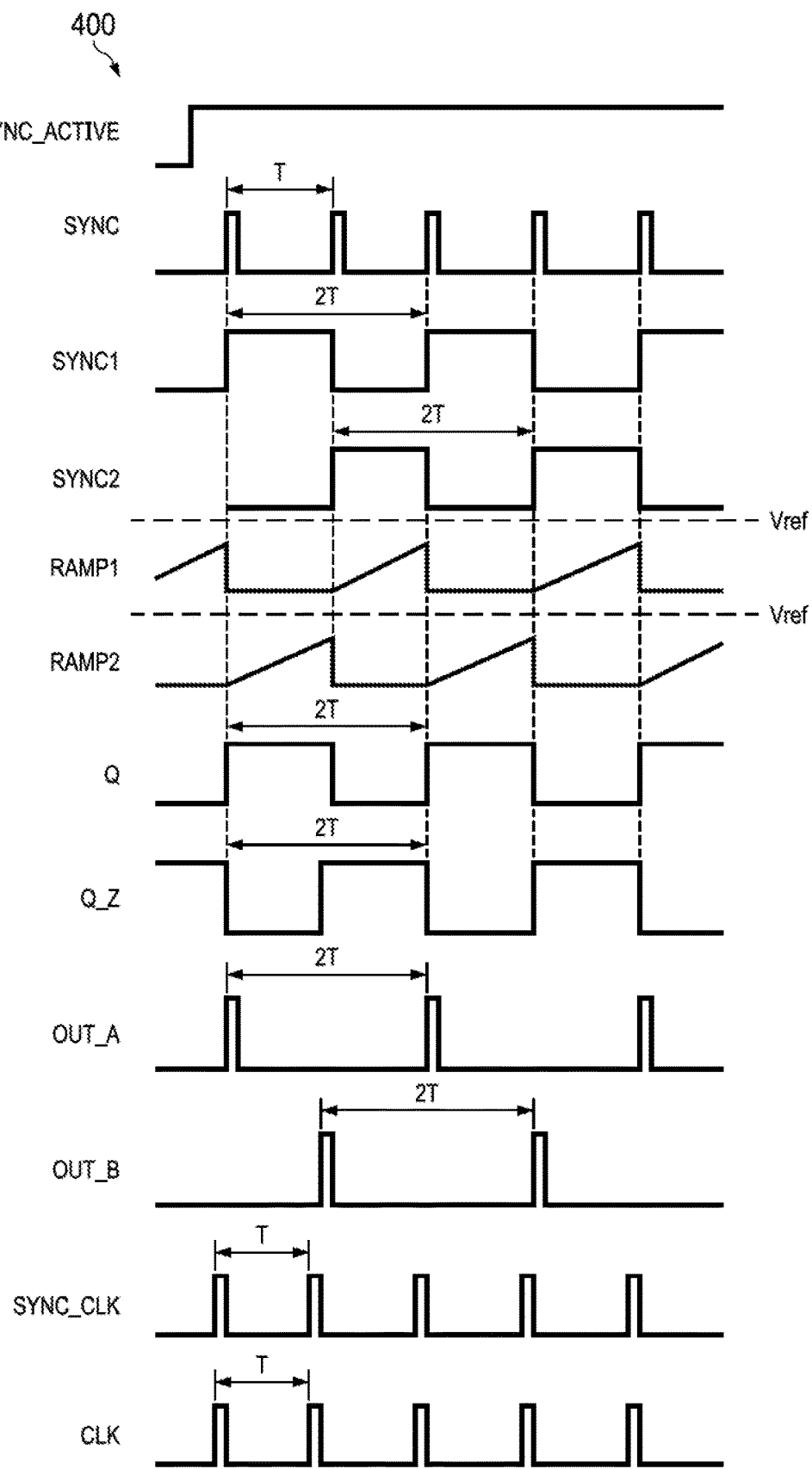
FIG. 4 shows a diagram of illustrative signals in accordance with various examples.

Turning now to FIG. 4, a diagram 400 of illustrative waveforms is shown. In at least some examples, the diagram 400 is representative of at least some signals present in the circuit 200 of FIG. 2 or the circuit 300 of FIG. 3, and reference may be made to elements of the circuit 200 or the circuit 300 in describing the diagram 400. In at least some examples, the diagram 400 illustrates at least some signals present in the circuit 200 and/or the circuit 300 when SYNC is received having a logical high value and SYNC_ACTIVE has a logical high value.

As illustrated in the diagram 400, SYNC has a period of T. When SYNC1 and SYNC2 are generated by the d-flip flop 206, SYNC1 has a same phase as SYNC but a period of 2T and SYNC2 has a phase shifted, in some examples, by 180 degrees from SYNC and SYNC1, as well as a period of, in some examples, 2T. Because SYNC_ACTIVE has a logical high value, as shown in the diagram 400, neither RAMP1, nor RAMP2, reaches Vref prior to toggling of Q or Q_Z to discharge and reset RAMP1 or RAMP 2, respectively. When SYNC1 has a logical high value, Q is set by the latch 212 to also have a logical high value and when SYNC2 has a logical high value (e.g., corresponding to a logical low value of SYNC1), the latch 212 resets Q to have a logical low value until another logical high value of SYNC1 occurs. The two-edge OR circuit 214, represented in one example by the circuit 300, detects both the rising edge of Q and the rising edge of Q_Z (which is, in some examples, representative of a falling edge of Q) and reflects these rising edges in OUT_A and OUT_B, respectively. OUT_A and OUT_B are then combined by the two-edge OR circuit 214, using an OR logical operation, to generate SYNC_CLK at substantially the same frequency and phase as SYNC and output, via the multiplexer 216, SYNC_CLK as CLK when SYNC_ACTIVE has the logical high value.

Figure 5:
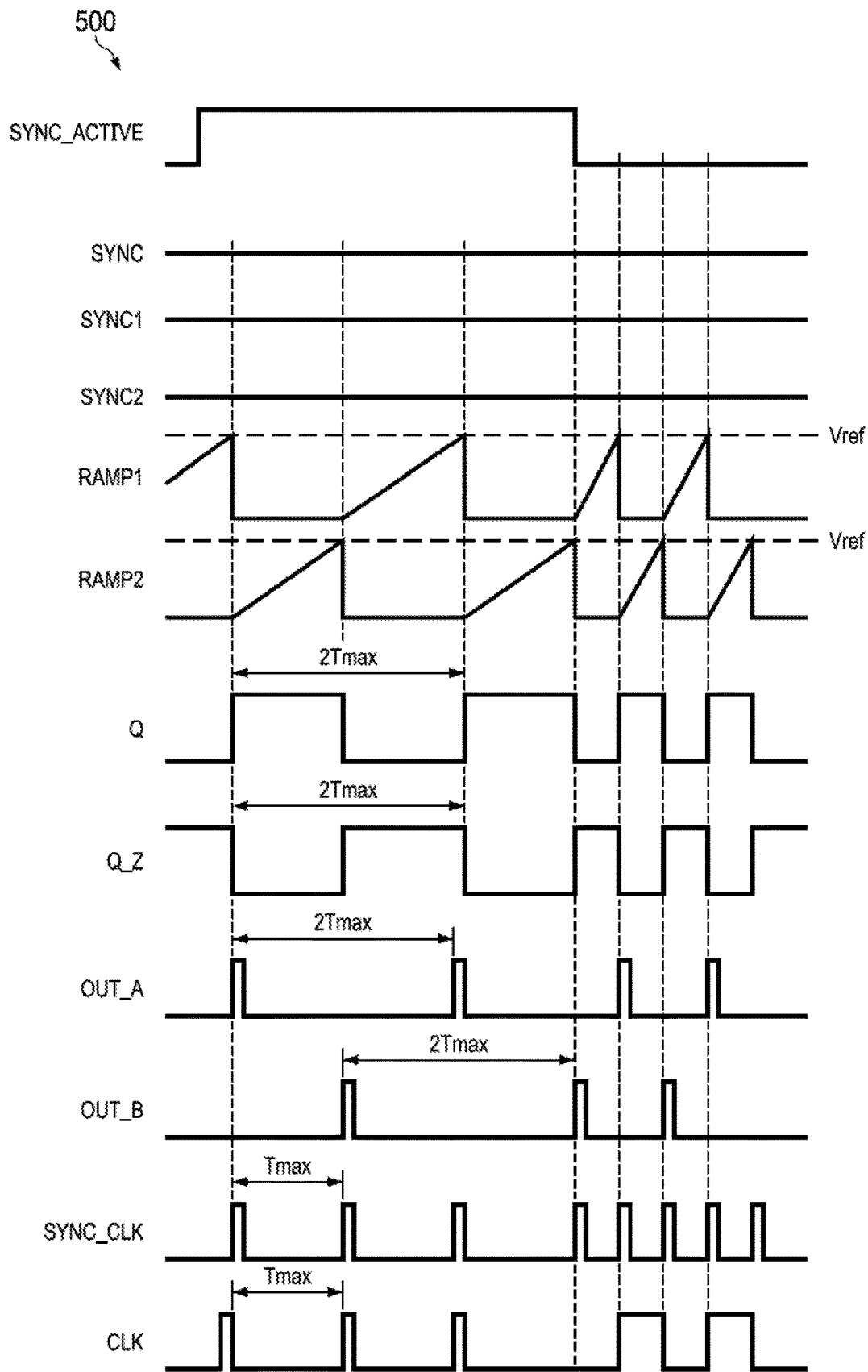
FIG. 5 shows a diagram of illustrative signals in accordance with various examples.

Turning now to FIG. 5, a diagram 500 of illustrative waveforms is shown. In at least some examples, the diagram 500 is representative of at least some signals present in the circuit 200 of FIG. 2 or the circuit 300 of FIG. 3, and reference may be made to elements of the circuit 200 or the circuit 300 in describing the diagram 500. In at least some examples, the diagram 500 illustrates at least some signals present in the circuit 200 and/or the circuit 300 when SYNC is received having a logical low value (or is not received) and SYNC_ACTIVE has a logical high value transitioning to a logical low value.

As illustrated in the diagram 500, SYNC is either received having a logical low value or is not received by the circuit 200. Correspondingly, SYNC1 and SYNC2 each have logical low values. Because SYNC_ACTIVE has a logical high value but SYNC1 and SYNC2 have logical low values, Q and Q_Z are controlled based on values of RAMP1 and RAMP2. For example, while RAMP1 and RAMP 2 did not reach Vref in the above diagram 400 due to values of SYNC1 and SYNC2, in the diagram 500 when RAMP1 reaches Vref, a rising edge occurs in Q, a falling edge occurs in Q_Z, RAMP1 discharges, and RAMP1 begins charging. Similarly, when RAMP2 reaches Vref, a falling edge occurs in Q, a rising edge occurs in Q_Z, RAMP2 discharges, and RAMP1 begins discharging. A period of both Q and Q_Z, in at least some examples, is 2*Tmax (e.g., resulting from RAMP1 and RAMP2 charging at a slow rate) when SYNC is not received and SYNC_ACTIVE has the logical high value, as discussed above. In at least some examples, OUT_A, OUT_B, SYNC_CLK, and CLK are generated substantially the same as discussed above with respect to diagram 400.

At a time t1, SYNC_ACTIVE transitions from the logical high value to a logical low value. In at least some examples, SYNC_ACTIVE transitions from the logical high value to the logical low value after three rising edges occur in CLK without receipt of a rising edge of SYNC (e.g., such as discussed above with respect to the sync determination circuit 204). When SYNC_ACTIVE has the logical low value, RAMP1 and RAMP2 charge at an increased rate, as discussed above. Q and Q_Z are generated substantially the same as discussed above with respect to the diagram 500 and Q is output, via the multiplexer 216, as CLK when SYNC_ACTIVE has the logical low value. In at least some examples, OUT_A, OUT_B, and SYNC_CLK are ignored when SYNC_ACTIVE has the logical low value.

Figure 6:
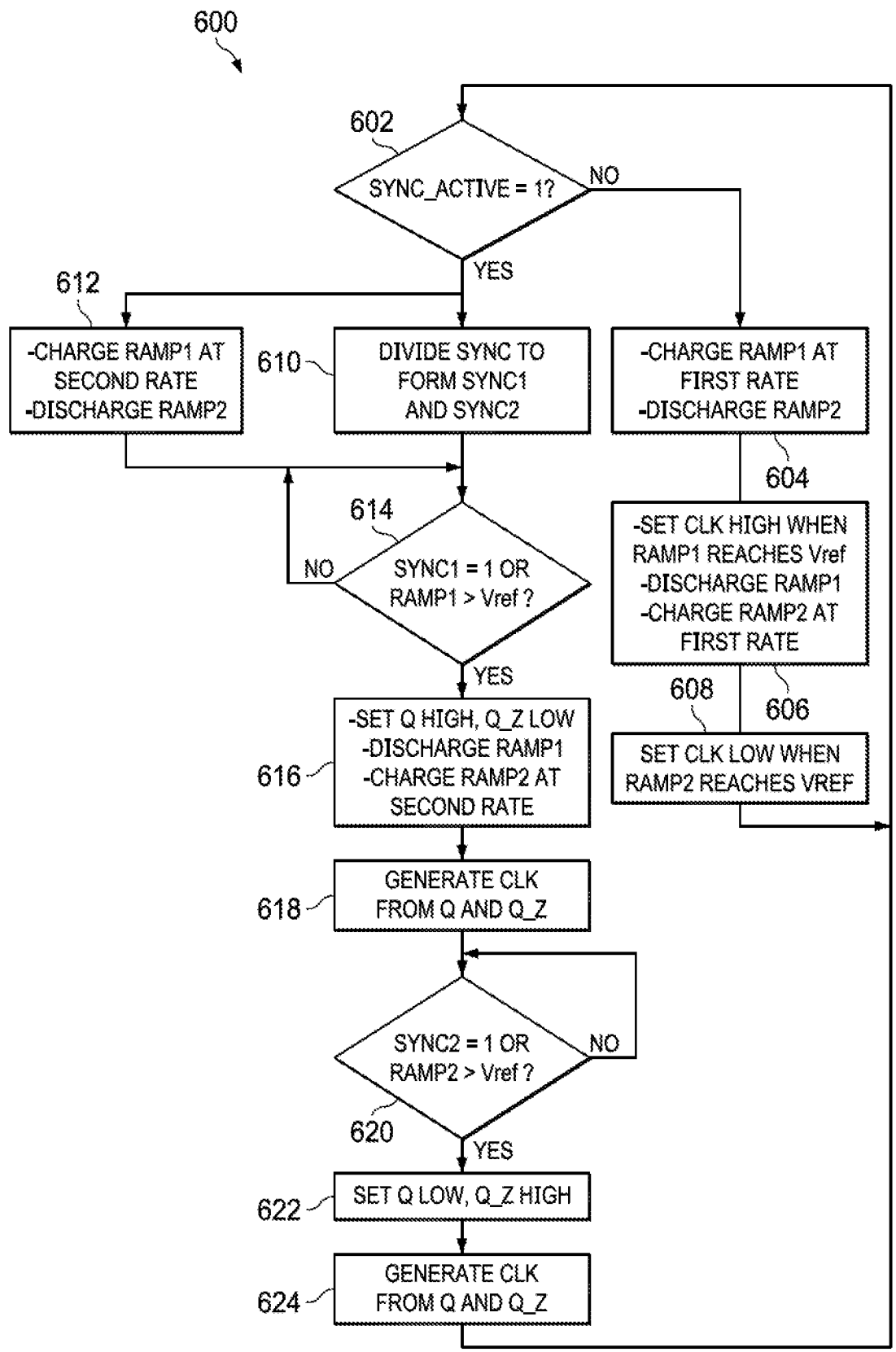
FIG. 6 shows a flowchart of an illustrative method in accordance with various examples.

Turning now to FIG. 6, a flowchart of an illustrative method 600 is shown. In at least some examples, the method 600 is suitable for implementation by the circuit 200 of FIG. 2 and/or the circuit 300 of FIG. 3, while in other examples the method 600 is suitable for implementation by other circuit architectures that provide substantially similar functionality to that discussed herein.

At operation 602, a determination is made whether SYNC_ACTIVE has a logical high value. In at least some examples, the determination of whether SYNC_ACTIVE has the logical high value (e.g., SYNC_ACTIVE=1) includes analyzing CLK and/or SYNC. For example, when three rising edges occur in CLK without a rising edge occurring in SYNC, SYNC_ACTIVE is set to a logical low value (e.g., SYNC_ACTIVE=0). When SYNC_ACTIVE=1 and a rising edge of SYNC occurs before three rising edges of CLK occur, SYNC_ACTIVE remains as the logical high value. When SYNC_ACTIVE=0, the method 600 proceeds to operation 604. When SYNC_ACTIVE has the logical high value (e.g., when SYNC_ACTIVE=1), the method 600 proceeds to operations 610 and 612.

At operation 604, RAMP1 is charged at a first rate and RAMP2 is discharged. In some examples, RAMP1 is charged by controlling a switch to cause a capacitor generating RAMP1 to begin charging. For example, the switch is a transistor that is controlled to turn on and enter a conductive state, providing current to the capacitor such that a value of RAMP1 at a given time is substantially equal to an integration by the capacitor of the current received by the capacitor from the switch. RAMP2 is discharged, in some examples, by controlling a switch to cause a capacitor generating RAMP2 to be discharged to a ground potential.

At operation 606, when RAMP1 reaches Vref, CLK is set to a logical high value, RAMP1 is discharged, and RAMP2 begins charging at the first rate. In some examples, the determination that RAMP1 reaches Vref is made by a comparator comparing RAMP1 to Vref and CLK is set high by setting a latch output when RAMP1 reaches Vref. In some examples, RAMP2 is charged by controlling a switch to cause the capacitor generating RAMP2 to begin charging. For example, the switch is a transistor that is controlled to turn on and enter a conductive state, providing current to the capacitor such that a value of RAMP2 at a given time is substantially equal to an integration by the capacitor of the current received by the capacitor from the switch. RAMP1 is discharged, in some examples, by controlling a switch to cause the capacitor generating RAMP1 to be discharged to a ground potential.

At operation 608, when RAMP2 reaches Vref, CLK is set to a logical low value, completing one period of CLK. In some examples, the determination that RAMP2 reaches Vref is made by a comparator comparing RAMP2 to Vref and CLK is set low by resetting a latch output when RAMP2 reaches Vref. The method 600 proceed from operation 608 to operation 602 to continue operation for a next period of CLK.

Returning now to operation 610, at operation 610, a received SYNC signal is divided to form SYNC1 and SYNC2. In at least some examples, SYNC1 and SYNC2 each have a frequency less than SYNC and SYNC2 is phase shifted from both SYNC and SYNC1. The division of SYNC is performed, in some examples, by a d-flip flop. In at least some examples, SYNC is not received and the operation 610 is skipped in the method 600.

At operation 612, RAMP1 is charged at a second rate and RAMP2 is discharged. In at least some examples, the second rate is less than the first rate such that RAMP1 charges slower at operation 612 than at operation 604. In some examples, the first rate and the second rate are controlled by modifying the amount of current provided to the capacitor generating RAMP1, for example, by modifying an amount of resistance associated with generation of the current by controlling a switch based on SYNC_ACTIVE=1.

At operation 614, a determination is made whether SYNC1 has a logical high value (e.g., SYNC1=1) or RAMP1 is greater than Vref. In at least some examples, the determination is made by analog and/or digital circuitry configured to perform logical operations (e.g., such as a logical OR operation). When SYNC1=1 or RAMP1 is greater than Vref, the method 600 proceeds to operation 616. When SYNC1 has a logical low value and RAMP1 is less than Vref, the method 600 remains at operation 614.

At operation 616, Q is set to have a logical high value and Q_Z is set to have a logical low value. Additionally, at operation 616 RAMP1 is discharged and RAMP2 is charged at the second rate. In at least some examples, Q is set to have the logical high value by setting the latch and Q_Z is output by the latch as an inversion of Q.

At operation 618, CLK is generated from Q and Q_Z. For example, CLK is generated having substantially a same frequency and phase as SYNC by detecting a rising edge in Q and detecting a rising edge in Q_Z and generating rising edges in CLK corresponding to both the rising edges in Q and the rising edges in Q_Z. The detections are performed, in some examples, by one or more d-flip flops and logic circuitry configured to perform a logical operation, such as a logical OR operation.

At operation 620, a determination is made whether SYNC2 has a logical high value (e.g., SYNC2=1) or RAMP2 is greater than Vref. In at least some examples, the determination is made by analog and/or digital circuitry configured to perform logical operations (e.g., such as a logical OR operation). When SYNC2=1 or RAMP2 is greater than Vref, the method 600 proceeds to operation 622. When SYNC2 has a logical low value and RAMP2 is less than Vref, the method 600 remains at operation 620.

At operation 622, Q is set to have a logical low value and Q_Z is set to have a logical high value. Additionally, at operation 622 RAMP2 is discharged and RAMP1 is charged at the second rate. In at least some examples, Q is set to have the logical low value by resetting the latch and Q_Z is output by the latch as an inversion of Q.

At operation 624, CLK is generated from Q and Q_Z. For example, CLK is generated in substantially the same manner as described with respect to operation 618.

While the operations of the method 600 have been discussed and labeled with numerical reference, the method 600 may include additional operations that are not recited herein (e.g., such as intermediary comparisons, logical operations, output selections such as via a multiplexer, etc.), any one or more of the operations recited herein may include one or more sub-operations (e.g., such as intermediary comparisons, logical operations, output selections such as via a multiplexer, etc.), any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, drain-extended, natural, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
    a dual-ramp generator;
    a d-flip flop having a first input coupled to a first node, a second input coupled to a second node, a first output, and a second output coupled to the second node;
    a first logic circuit having a first input coupled to the second node, a second input coupled to a first output of the dual-ramp generator, and an output;
    a second logic circuit having a first input coupled to the first output of the d-flip flop, a second input coupled to a second output of the dual-ramp generator, and an output;
    a latch having a first input coupled to the output of the first logic circuit, a second input coupled to the output of the second logic circuit, a first output coupled to a third node, and a second output coupled to a fourth node; and
    a two-edge OR circuit having a first input coupled to the first output of the latch, a second input coupled to the second output of the latch, and an output.

2. The circuit of claim 1, wherein the two-edge OR circuit comprises:
    a second d-flip flop having a first input coupled to the third node, a second input configured to receive a logical high value, a third input, and an output;
    a first resistor coupled between the output of the second d-flip flop and a fifth node;
    a first capacitor coupled between the fifth node and a ground terminal;
    a first inverter coupled between the fifth node and the third input of the second d-flip flop;
    a third d-flip flop having a first input coupled to the fourth node, a second input configured to receive a logical high value, a third input, and an output;
    a second resistor coupled between the output of the second d-flip flop and a sixth node;
    a second capacitor coupled between the sixth node and the ground terminal;
    a second inverter coupled between the sixth node and the third input of the third d-flip flop; and
    a third logic circuit having a first input coupled to the output of the first d-flip flop, a second input coupled to the output of the second d-flip flop, and an output.

3. The circuit of claim 1, wherein the first logic circuit is a first digital logic OR gate, and wherein the second logic circuit is a second digital logic OR gate.

4. The circuit of claim 1, where the latch is a set-reset (SR) latch.

5. The circuit of claim 1, further comprising a multiplexer having a first input coupled to the third node, a second input coupled to the output of the two-edge OR circuit, an output coupled to an output node, and a control input.

6. The circuit of claim 5, further comprising a sync detection circuit having a first input coupled to the output node, a second input coupled to the first node, a first output coupled to the control input of the multiplexer, and a second output.

7. The circuit of claim 6, wherein the second output of the sync detection circuit is coupled to a control terminal of a switch of the dual-ramp generator, wherein the switch is configured to modify generation of the output of the dual-ramp generator based on a signal received via the second output of the sync detection circuit.

8. The circuit of claim 6, wherein the circuit is configured to sync a value of a signal present at the output node with a value of a signal received at the first node when a signal output at the first output of the sync detection circuit has a logical high value.

9. The circuit of claim 6, further comprising:
    a variable current source having a control input coupled to the second output of the sync detection circuit;
    a first transistor having a source terminal coupled to an output of the variable current source, a drain terminal coupled to a seventh node, and a gate terminal coupled to the fourth node;

a second transistor having a source terminal coupled to the seventh node, a drain terminal coupled to a ground terminal, and a gate terminal coupled to the fourth node;

a third capacitor coupled between the seventh node and the ground terminal;

a first comparator having a first input coupled to the seventh node, a second input configured to receive a reference signal, and an output configured to provide a first output of the dual-ramp generator;

a third transistor having a source terminal coupled to the output of the variable current source, a drain terminal coupled to an eighth node, and a gate terminal coupled to the third node;

a fourth transistor having a source terminal coupled to the eighth node, a drain terminal coupled to the ground terminal, and a gate terminal coupled to the third node;

a fourth capacitor coupled between the eighth node and the ground terminal; and a second comparator having a first input coupled to the eighth node, a second input configured to receive the reference signal, and an output configured to provide a second output of the dual-ramp generator.

10. A system, comprising:

a clock generator configured to generate a clock signal (CLK), the clock generator comprising:

a dual-ramp generator having a first output and a second output, the dual-ramp generator configured to output a signal having a logical high value at the second output of the dual-ramp generator when a first ramp signal (RAMP1) exceeds a reference voltage (Vref) and output a signal having a logical high value at the first output of the dual-ramp generator when a second ramp signal (RAMP2) exceeds Vref;

a sync detection circuit having a first input, a second input coupled to a first node configured to receive a synchronization signal (SYNC), a first output, and a second output, the sync detection circuit configured to generate a synchronization active signal (SYNC_ACTIVE) based at least partially on CLK and SYNC;

a d-flip flop having a first input coupled to the first node, a second input coupled to a second node, a data output, and a data inverse output coupled to the second node, the d-flip flop configured to divide SYNC to generate a first divided signal (SYNC1) and a second divided signal (SYNC2);

a first logical OR circuit having a first input coupled to the second node, a second input coupled to the first output of the dual-ramp generator, and an output;

a second logical OR circuit having a first input coupled to the first output of the d-flip flop, a second input coupled to the second output of the dual-ramp generator, and an output;

a latch having a reset input coupled to the output of the first logical OR circuit, a set input coupled to the output of the second logical OR circuit, a data output coupled to a third node, and a data inverse output coupled to a fourth node, the latch configured to output a signal Q via the data output and a signal Q_Z via the data inverse output;

a two-edge OR circuit having a first input coupled to the first output of the latch, a second input coupled to the second output of the latch, and an output, the two-edge OR circuit configured to generate a signal SYNC_CLK having rising edges corresponding to rising edges in both Q and Q_Z; and a multiplexer having a first input coupled to the third node, a second input coupled to the output of the two-edge OR circuit, an output coupled to the first input of the sync detection block and configured to output CLK, and a control input coupled to the first output of the sync detection circuit, the multiplexer configured to output Q as CLK when SYNC_ACTIVE has a logical low value and output SYNC_CLK as CLK when SYNC_ACTIVE has a logical high value; and a processing element configured to receive and operate according to CLK.

11. The system of claim 10, wherein the dual-ramp generator comprises:

a variable current source having a control input coupled to the second output of the sync detection circuit;

a first transistor having a source terminal coupled to an output of the variable current source, a drain terminal coupled to a fifth node, and a gate terminal coupled to the fourth node;

a second transistor having a source terminal coupled to the fifth node, a drain terminal coupled to a ground terminal, and a gate terminal coupled to the fourth node;

a first capacitor coupled between the fifth node and the ground terminal;

a first comparator having a first input coupled to the fifth node, a second input configured to receive Vref, and an output configured to provide the first output of the dual-ramp generator;

a third transistor having a source terminal coupled to the output of the variable current source, a drain terminal coupled to a sixth node, and a gate terminal coupled to the third node;

a fourth transistor having a source terminal coupled to the sixth node, a drain terminal coupled to the ground terminal, and a gate terminal coupled to the third node;

a second capacitor coupled between the sixth node and the ground terminal; and a second comparator having a first input coupled to an eighth node, a second input configured to receive Vref, and an output configured to provide the second output of the dual-ramp generator.

12. The system of claim 10, wherein the two-edge OR circuit comprises:

a second d-flip flop having a first input coupled to the third node, a second input configured to receive a logical high value, a third input, and an output;

a first resistor coupled between the output of the second d-flip flop and a seventh node;

a third capacitor coupled between the seventh node and a ground terminal;

a first inverter coupled between the seventh node and the third input of the second d-flip flop;

a third d-flip flop having a first input coupled to the fourth node, a second input configured to receive a logical high value, a third input, and an output;

a second resistor coupled between the output of the second d-flip flop and an eighth node;

a fourth capacitor coupled between the eighth node and the ground terminal;

a second inverter coupled between the eighth node and the third input of the third d-flip flop; and a third logical OR circuit having a first input coupled to the output of the first d-flip flop, a second input coupled to the output of the second d-flip flop, and an output coupled to the second input of the multiplexer.

13. The system of claim 10, wherein the sync detection circuit is configured to output SYNC_ACTIVE having a logical low value when three rising edges occur in CLK prior to a rising edge in SYNC.

14. The system of claim 10, wherein the clock generator is configured to sync CLK to SYNC when SYNC_ACTIVE has a logical high value and SYNC is received, and wherein the clock generator is configured to generate CLK according to RAMP1 and RAMP2 when SYNC_ACTIVE has a logical low value or SYNC_ACTIVE has a logical high value and SYNC is not received.

15. A method, comprising:
receiving a synchronization signal;
dividing the synchronization signal to form a first divided signal and a second divided signal;
generating a first ramp signal and a second ramp signal;
setting a latch output to a logical high value when the first divided signal has a logical high value or a value of the first ramp signal exceeds a value of a reference signal;
setting the latch output to a logical low value when the second divided signal has a logical high value or a value of the second ramp signal exceeds the value of the reference signal;
generating a synchronization clock according to the latch output and an inverse of the latch output; and
outputting the latch output or the synchronization clock as a clock signal based on a value of a synchronization active signal.

16. The method of claim 15, wherein the first divided signal and the second divided signal have a frequency less than the synchronization signal, wherein the second divided signal has a phase shifted from the synchronization signal, and wherein the synchronization clock has a same frequency and phase as the synchronization signal.

17. The method of claim 15, wherein generating the synchronization clock according to the latch output and the inverse of the latch output comprises:
detecting a rising edge in the latch output;
detecting a rising edge in the inverse of the latch output; and
generating the synchronization clock having rising edges corresponding to the rising edge in the latch output and the rising edge in the inverse of the latch output.

18. The method of claim 15, further comprising setting the synchronization active signal to a logical low value when three rising edges occur in the clock signal prior to a rising edge occurring in the synchronization signal.

19. The method of claim 15, further comprising controlling a charging rate of the first ramp signal and the second ramp signal according to the synchronization active signal.

20. The method of claim 15, wherein determining whether to output the latch output or the synchronization clock as the clock signal is further based on receipt of the synchronization signal.

* * * * *